US012624966B2

(12) United States Patent
Poli et al.

(10) Patent No.: US 12,624,966 B2
(45) Date of Patent: May 12, 2026

(54) MICROELECTROMECHANICAL SENSOR DEVICE WITH IMPROVED MANAGEMENT OF A POWER-DOWN CONDITION

(71) Applicant: STMicroelectronics International N.V., Geneva (CH)

(72) Inventors: Salvatore Poli, Milan (IT); Carmela Marchese, Milan (IT)

(73) Assignee: STMicroelectronics International N.V., Geneva (CH)

( * ) Notice: Subject to any disclaimer, the term of this patent is extended or adjusted under 35 U.S.C. 154(b) by 377 days.

(21) Appl. No.: 18/512,936

(22) Filed: Nov. 17, 2023

(65) Prior Publication Data

US 2024/0200980 A1 Jun. 20, 2024

(30) Foreign Application Priority Data

Dec. 14, 2022 (IT) ........................ 102022000025629

(51) Int. Cl.
*G01D 3/036* (2006.01)
*B81B 7/00* (2006.01)
*G05F 1/46* (2006.01)

(52) U.S. Cl.
CPC ............. *G01D 3/036* (2013.01); *B81B 7/008* (2013.01); *G05F 1/46* (2013.01); *B81B 2207/03* (2013.01)

(58) Field of Classification Search
CPC ........... G01D 3/036; G05F 1/46; B81B 7/008; B81B 2207/03
See application file for complete search history.

(56) References Cited

U.S. PATENT DOCUMENTS

| | | | |
|---|---|---|---|
| 8,601,302 B2 | 12/2013 | Lachwani et al. | |
| 9,037,890 B2 * | 5/2015 | De Caro ............... | G06F 1/3296 |
| | | | 713/320 |
| 9,780,644 B1 * | 10/2017 | Tapadia ............. | H03K 19/0016 |
| 9,922,684 B2 | 3/2018 | Pedersen et al. | |
| 10,162,399 B2 * | 12/2018 | Atkinson .................. | G06F 1/26 |
| 10,445,227 B2 | 10/2019 | Tsutsui | |

(Continued)

*Primary Examiner* — Stephanie E Bloss
*Assistant Examiner* — Diana Hancock
(74) *Attorney, Agent, or Firm* — Seed Intellectual Property Law Group LLP

(57) ABSTRACT

A microelectromechanical sensor device has a detection structure and an associated electronic circuitry, configured to receive, when the device is powered, an external power supply voltage and provided with a voltage regulator generating a regulated voltage and with at least one voltage domain powered by the regulated voltage. The electronic circuitry has a power supply management core, always powered by the external power supply voltage and which controls the voltage regulator to selectively interrupt the power supply of the voltage domain to implement: a first power-down condition wherein the voltage regulator is disabled; and a second power-down condition wherein the voltage regulator is enabled to power the aforementioned voltage domain through the regulated voltage, the first and the second power-down conditions being associated with absence of data acquisition and/or processing by the sensor device. The power supply management core automatically enables the first or second power-down condition upon a first power-on of the sensor device, as a function of a configuration signal, programmable, for example, during a factory calibration step.

20 Claims, 8 Drawing Sheets

(56)        References Cited

U.S. PATENT DOCUMENTS

| 10,802,736 | B2 | 10/2020 | Shin et al. |
| 2009/0204831 | A1 | 8/2009 | Cousson et al. |
| 2015/0155860 | A1 | 6/2015 | Park et al. |
| 2021/0368625 | A1 | 11/2021 | Matsumoto et al. |
| 2024/0201717 | A1* | 6/2024 | Marchese ............. G06F 1/3203 |

* cited by examiner

MICROELECTROMECHANICAL SENSOR DEVICE WITH IMPROVED MANAGEMENT OF A POWER-DOWN CONDITION

BACKGROUND

Technical Field

The present disclosure relates to a microelectromechanical sensor (MEMS) device, with improved management of a power-down condition.

Description of the Related Art

In a known manner, there are several applications of MEMS sensor devices, defined as "ultra low power" applications, where an extremely low power consumption is desired, for example in wearable or hearable apparatuses, such as electronic watches or bands or bracelets, earphones, smart contact lenses, smart pens or the like.

One problem affecting MEMS sensor devices in such applications is represented by the power consumption while in power-on but inactive state (i.e., which occurs when the same sensor devices are not in the operating phase, for data acquisition and/or processing).

In the field of these MEMS sensor devices (such as for example accelerometers, gyroscopes, pressure sensors, etc.), commonly used in the aforementioned applications having low power consumption, it is known that a part of the power consumption is given by the electronic circuitry, known as ASIC (Application Specific Integrated Circuit), associated with a corresponding micromechanical detection structure, the latter configured for the detection of the quantity(ies) of interest (for example, acceleration, angular speed, pressure, etc.).

In particular, in the inactive (power-down) condition, it is known that the consumption of the aforementioned electronic circuitry is mainly due to leakage currents.

Minimization of these leakage currents, whose value varies also in a significant manner, for example, as a function of temperature, voltage or manufacturing process, thus represents an important constraint in the design of MEMS sensor devices, in particular in the aforementioned low-power consumption applications.

A solution that has been proposed to reduce power consumption provides for a so-called multi-domain (or multi-voltage) approach according to which the aforementioned electronic circuitry is divided into a certain number of separate domains (or independent portions), each of which may be selectively powered, even at different voltages, such as to have the possibility of switching-off (deactivating) one or more of these domains, with a resulting power saving in the power-down condition.

In particular, to reduce consumptions, propagation delays and area occupation, a digital or logic part of the aforementioned electronic circuitry is usually powered with a lower voltage with respect to the power supply voltage provided from the outside (for example from a battery), using voltage regulators that allow an under-regulated voltage to be generated starting from the external power supply voltage.

However, the aforementioned multi-domain approach uses power supply switches, associated with the aforementioned domains and controlled to selectively activate/deactivate the provision of the respective power supply voltage to the respective domains.

These power supply switches may be implemented externally to the MEMS sensor devices, with a consequent increase in the circuit complexity and in the size occupation and also with a control burden by the external processor (application or host processor) of the electronic apparatus wherein the same MEMS sensor devices are housed.

The same power supply switches may alternatively be implemented in an embedded manner within the MEMS sensor devices, in the corresponding electronic circuitry.

However, in this case, the control logic that controls switching of these power supply switches, which is implemented in the digital part of the electronic circuitry, is always powered, even in the power-down condition, with a resulting power consumption which may not be negligible, in particular due to the aforementioned voltage regulator (which provides the under-regulated power supply voltage to the digital part).

In general, the need is certainly felt to further optimize power consumption of MEMS sensor devices in power-down condition.

BRIEF SUMMARY

Various embodiments of the present solution solve, at least in part, the previously highlighted problems.

According to the present disclosure, a microelectromechanical sensor device and a corresponding method are provided. The microelectromechanical sensor device has a detection structure and an associated electronic circuitry, configured to receive, when the device is powered, an external power supply voltage and provided with a voltage regulator generating a regulated voltage and with at least one voltage domain powered by the regulated voltage. The electronic circuitry has a power supply management core, always powered by the external power supply voltage and which controls the voltage regulator to selectively interrupt the power supply of the voltage domain to implement: a first power-down condition wherein the voltage regulator is disabled; and a second power-down condition wherein the voltage regulator is enabled to power the aforementioned voltage domain through the regulated voltage, the first and the second power-down conditions being associated with absence of data acquisition and/or processing by the sensor device. The power supply management core automatically enables the first or second power-down condition upon a first power-on of the sensor device, as a function of a configuration signal, programmable, for example, during a factory calibration step.

BRIEF DESCRIPTION OF THE SEVERAL VIEWS OF THE DRAWINGS

For a better understanding of the present disclosure, various embodiments thereof are now described, purely by way of non-limiting example and with reference to the attached drawings, wherein.

DETAILED DESCRIPTION

As will be described in detail below, an aspect of the present solution provides for implementing, in the electronic circuitry of a microelectromechanical sensor (MEMS) device, at least two different and distinct voltage domains (i.e., distinct portions powered at different voltages): a first domain, which defines an always-on core in the presence of an external power supply voltage (provided from outside of the microelectromechanical sensor device), powered by the same external power supply voltage; and at least one second domain, powered by a voltage regulator at a voltage that is different from, in particular lower than, the external power supply voltage, selectively switchable into an on- or off-condition by the aforementioned always-on core.

In particular, a so-called deep power-down condition is implemented, in the microelectromechanical sensor device, by powering off the voltage regulator and the voltage domains associated therewith, in particular the aforementioned second domain. In this deep power-down condition, the power consumption is extremely low (of the order of at most a few tens of nA), being associated with the electrical consumption of the aforementioned always-on core and not from other components of the microelectromechanical sensor device 1.

This always-on core is also configured to manage the transition between the aforementioned deep power-down condition and a different power-down condition, defined here as a soft power-down condition, during which the aforementioned voltage regulator is powered on.

In this soft power-down condition, most of the circuit stages of the microelectromechanical sensor device are switched to the inactive state in order to reduce the power consumption, by a switching control logic powered by the aforementioned voltage regulator. In this condition, therefore, the leakage of the aforementioned control logic affects the consumption, together with the quiescent consumption of the same voltage regulator.

Figure 1:
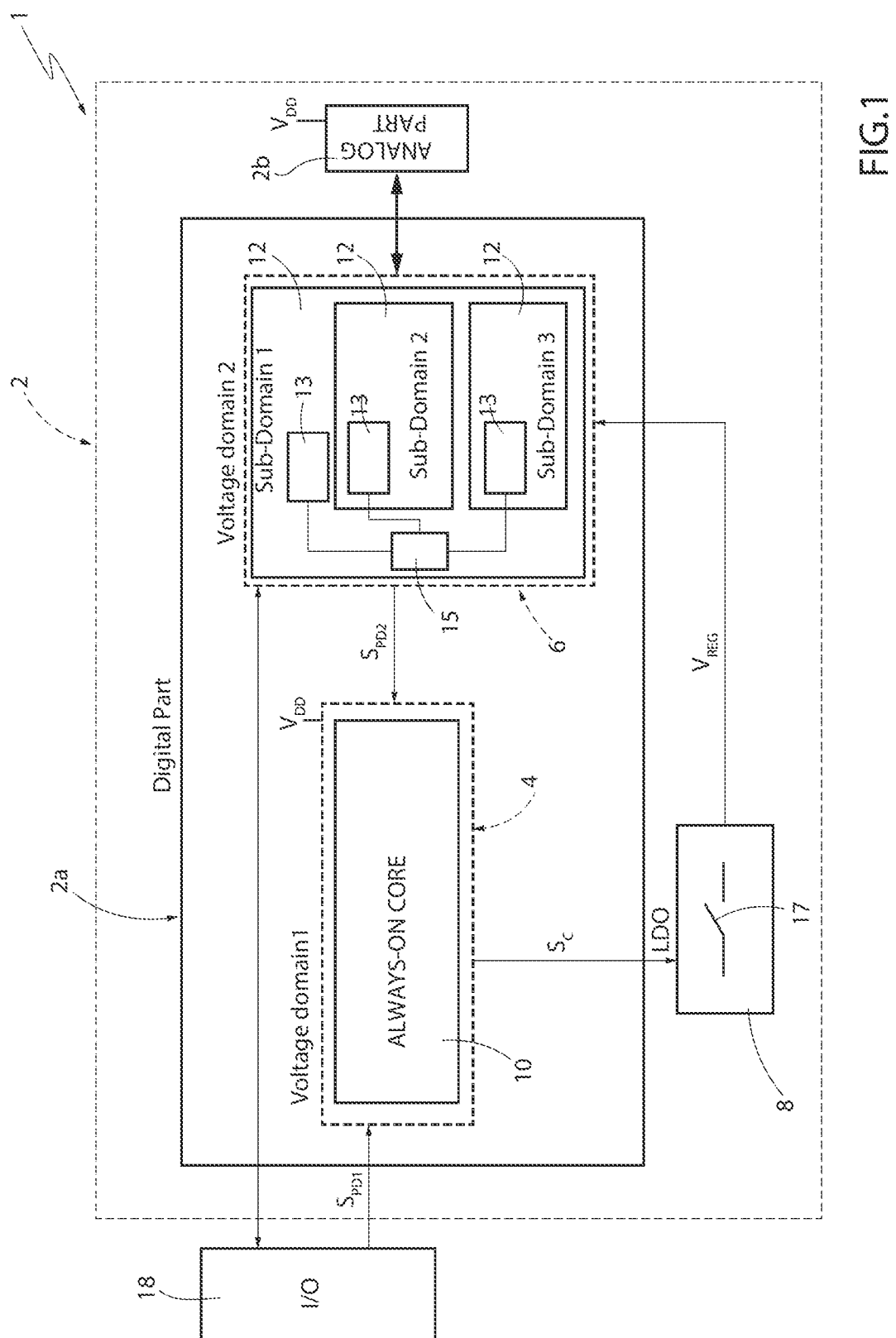
FIG. 1 is a block diagram of the electronic circuitry of a microelectromechanical sensor device, according to an embodiment of the present solution.

FIG. 1 schematically shows the architecture of a microelectromechanical sensor device 1, according to an embodiment of the present solution.

The microelectromechanical sensor device 1 comprises a micromechanical detection structure (of a known type, here not illustrated), configured to sense one or more detection quantities; and an electronic circuitry 2, operatively coupled to the micromechanical detection structure and configured to receive and process the aforementioned detection quantity.

In particular, the electronic circuitry 2 comprises a digital part 2a and an analog part 2b.

The digital part 2a comprises, as will be evident to a person skilled in the art, logic or digital elements such as registers, timing elements, logic gates and processing modules for performing a set of logic operations (in particular in the form of algorithms); in a possible implementation, this digital part 2a may comprise a processing unit, such as a microcontroller, a microprocessor or a similar embedded digital processing unit.

The electronic circuitry 2 is configured to receive from outside the microelectromechanical sensor device 1, for example from a battery (not illustrated here) of an electronic apparatus, in particular of the portable or wearable type, where the same microelectromechanical sensor device 1 is used, an external power supply voltage $V_{DD}$, for example comprised between 1.71 V and 3.6 V.

According to an aspect of the present solution, the digital part 2a comprises a first voltage domain 4, powered by the external power supply voltage $V_{DD}$; and at least one second voltage domain 6, separate and distinct from the first voltage domain 4, powered by a regulated voltage $V_{REG}$, having a lower value than the external power supply voltage $V_{DD}$, for example equal to 1.2 V.

In particular, this regulated voltage $V_{REG}$ is generated by a voltage regulator 8, for example of the LDO (Low Drop-Out) type.

The analog part 2b of the electronic circuitry 2 may also be powered by the aforementioned external power supply voltage $V_{DD}$.

The first voltage domain 4 comprises an always-on core 10, which includes a control logic of very low complexity and small dimensions (for example a few tens of thousands of square microns), configured to manage the electric power supply mode of the microelectromechanical sensor device 1 and in particular the transition between the aforementioned deep power-down and soft power-down conditions.

The second voltage domain 6 comprises digital resources powered by the aforementioned regulated voltage $V_{REG}$, which in turn may be divided into multiple sub-domains 12, distinct from each other and selectively controllable in power-on or in power-off, as shown schematically through power supply switching elements 13, by a switching control logic 15 (also powered by the aforementioned regulated voltage $V_{REG}$). This switching control logic 15, for example, is configured to receive from the outside (for example from an application, or host, processor of the electronic apparatus wherein the microelectromechanical sensor device 1 is used) and decode suitable commands to manage power-on of the aforementioned sub-domains 12.

In the embodiment illustrated, in particular, a main sub-domain (sub-domain 1) is present, wherein the aforementioned switching control logic 15 and a number of secondary sub-domains (in the example sub-domain 2 and sub-domain 3) are implemented.

In a possible embodiment, this second voltage domain 6 comprises all the digital resources of the digital part 2a of the electronic circuitry 2, except for the (minimum) resources dedicated to the implementation of the aforementioned always-on core 10 in the first voltage domain 4.

In detail, the always-on core 10 is configured to control switching-off or switching-on of the voltage regulator 8 by means of a control signal $S_C$ generated by the same always-on core 10 and provided to the voltage regulator 8; schematically, FIG. 1 shows a power-on switch 17, which is controlled by the aforementioned control signal $S_C$ to switch-off (for example, with a high value of the control signal $S_C$) or switch-on (for example, with a low value of the control signal $S_C$) the voltage regulator 8, disabling or enabling generation of the regulated voltage $V_{REG}$.

In the deep power-down condition, the voltage regulator 8, and, consequently, the second voltage domain 6 (and the corresponding sub-domains 12), are powered off, deactivated, so as to minimize power consumption. In this condition, the power consumption of the electronic circuitry 2 is substantially due to the always-on core 10 (being the second voltage domain 6 not powered), which, as indicated, comprises the minimum control logic to manage power-on of the voltage regulator 8. The power consumption in deep power-down condition is therefore very small.

The always-on core 10 is configured to manage the transition from the deep power-down condition to the soft power-down condition as a function of a first control signal $S_{PD1}$ received from the outside (for example from the application, or host, processor of the electronic apparatus in which the microelectromechanical sensor device 1 is used), at an input/output element (pad or pin) 18 of the microelectromechanical sensor device 1.

In particular, as will be discussed in detail below, as a function of the aforementioned first control signal $S_{PD1}$, the always-on core 10 causes power-on of the voltage regulator 8 and activation of the second voltage domain 6, to exit from the deep power-down condition and, initially, for the implementation of the soft power-down condition.

The always-on core 10 is also configured to receive a second control signal $S_{PD2}$, as a function of which, as will be discussed in detail below, causes power-off of the voltage regulator 8 and deactivation of the second voltage domain 6, for the implementation of the deep power-down condition.

In a possible embodiment, the always-on core 10 receives this second control signal $S_{PD2}$ (again from outside of the microelectromechanical sensor device 1) via the second voltage domain 6, which is also coupled to the input/output element 18 of the microelectromechanical sensor device 1.

Figure 2:
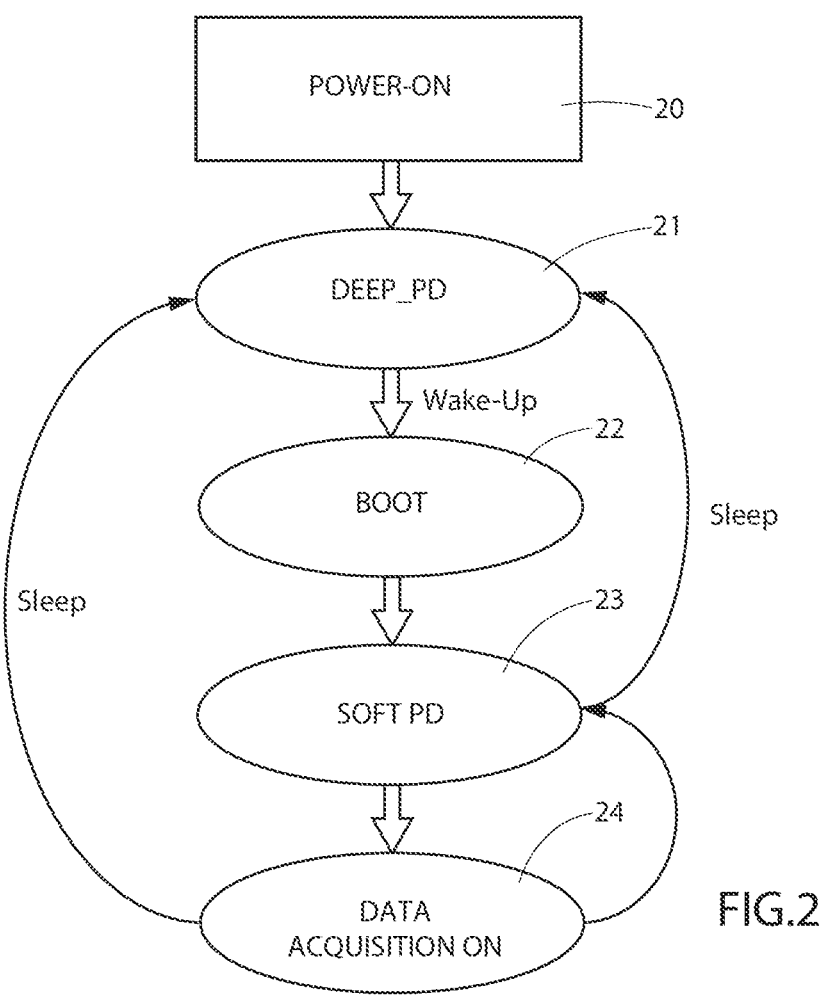
FIG. 2 is a flowchart of operations relating to the operation of the device of FIG. 1.

With reference to FIG. 2, a possible operating mode of the power supply management architecture of the microelectromechanical sensor device 1 is now described.

In detail, as shown in step 20, upon power-on of the microelectromechanical sensor device 1 (i.e., when the external power supply voltage $V_{DD}$ is provided, for example following an enable command generated by the application or host processor), the same microelectromechanical sensor device 1 is configured to automatically enter the deep power down (deep PD) condition, step 21, with the voltage regulator 8 which is powered off and therefore does not provide power supply to the second voltage domain 6 (the power-on switch 17 of FIG. 1 is open).

After receiving a dedicated wake-up command, represented for example by the first control signal $S_{PD1}$ received from the outside, the always-on core 10 (powered directly by the aforementioned external power supply voltage $V_{DD}$) powers on the voltage regulator 8 and enable supply of the regulated voltage $V_{REG}$ for powering the second voltage domain 6 (the power-on switch 17 is closed).

Then, as shown in step 22, in the same second voltage domain 6, preliminary operations are performed for retrieval of configuration and trimming information from a non-reprogrammable internal memory (or read-only memory, of the OTP—One Time Programmable—type), which are stored in volatile memory registers, to carry out the so-called "boot" or restore of the microelectromechanical sensor device 1.

Once the boot phase has ended, the microelectromechanical sensor device 1 then enters the soft power down (soft PD) condition, as shown in step 23.

Through the switching control logic 15 in the second voltage domain 6, activation of the respective sub-domains 12 may be managed in this condition to reduce a power consumption of the microelectromechanical sensor device 1 (as previously indicated, the switching control logic 15 may receive and decode suitable commands received for this purpose from the outside, for example from the aforementioned application processor, at the input/output element 18).

Subsequently, from this soft power down condition, the same microelectromechanical sensor device 1 may enter an operative or active (ON) condition, shown in step 24, in which the complete functionalities are ensured, for example for acquisition and processing of data (corresponding, for example, to the quantity to be sensed).

As previously discussed, the switching control logic 15 in the second voltage domain 6 may control for this purpose one or more of the power supply switching elements 13 to activate the respective sub-domains 12 and thus ensure the corresponding operativeness.

From this active condition, the microelectromechanical sensor device 1 may return to the soft power down condition, step 23 (in which the switching control logic 15 may possibly interrupt the power supply of one or more of the aforementioned sub-domains 12).

Furthermore, from the soft power down condition, or from the active condition, the microelectromechanical sensor device 1 may be returned into the deep power down condition, step 21.

In particular, upon receiving a dedicated power-down or sleep command, represented for example by the second control signal $S_{PD2}$ (received from the second voltage domain 6, which in turn receives a corresponding command from the outside, for example from the application or host processor), the sub-domains 12 are powered off (if they were still on) and then the always-on core 10 again powers off the voltage regulator 8, interrupting electrical power supply to the aforementioned second voltage domain 6.

The operation described is also illustrated with reference to the timing diagrams shown in FIG. 3 referring to the transition from a deep power down condition (for example, which immediately follows the power-on or activation of the microelectromechanical sensor device 1) into a soft power down condition (after receiving the aforementioned dedicated wake-up sequence, wake-up command).

Figure 3:
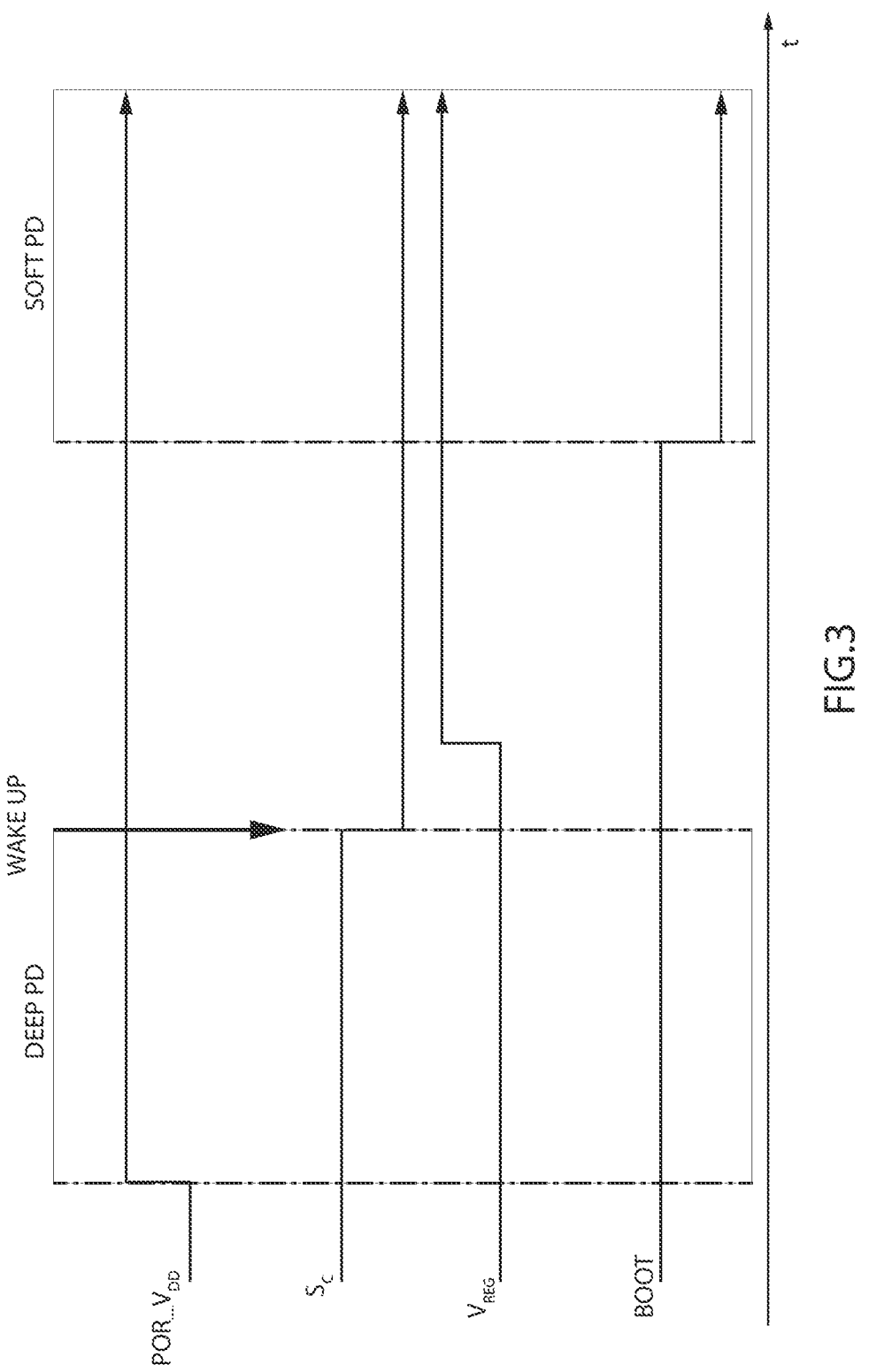
FIG. 3 shows timings of signals inherent to the operations shown in FIG. 2.

In particular, as shown in this FIG. 3, after enabling the external power supply voltage $V_{DD}$ (as represented by a power-on reset signal POR_$V_{DD}$), the deep power down condition is immediately activated; exit from this deep power down condition then occurs at the arrival of the dedicated wake-up sequence (as indicated by the arrow).

This dedicated wake-up sequence entails in particular power-on of the voltage regulator 8 (the control signal $S_C$ goes to the low state) and subsequent enabling of the regulated voltage $V_{REG}$ generated by the same voltage regulator 8.

At the end of the consequent restore operations (BOOT), the microelectromechanical sensor device 1 enters the soft power down condition, which will then evolve into the normal operativeness of the same device or, alternatively, again into the deep power down condition (in the manner previously described and not illustrated in the aforementioned FIG. 3).

Figure 4:
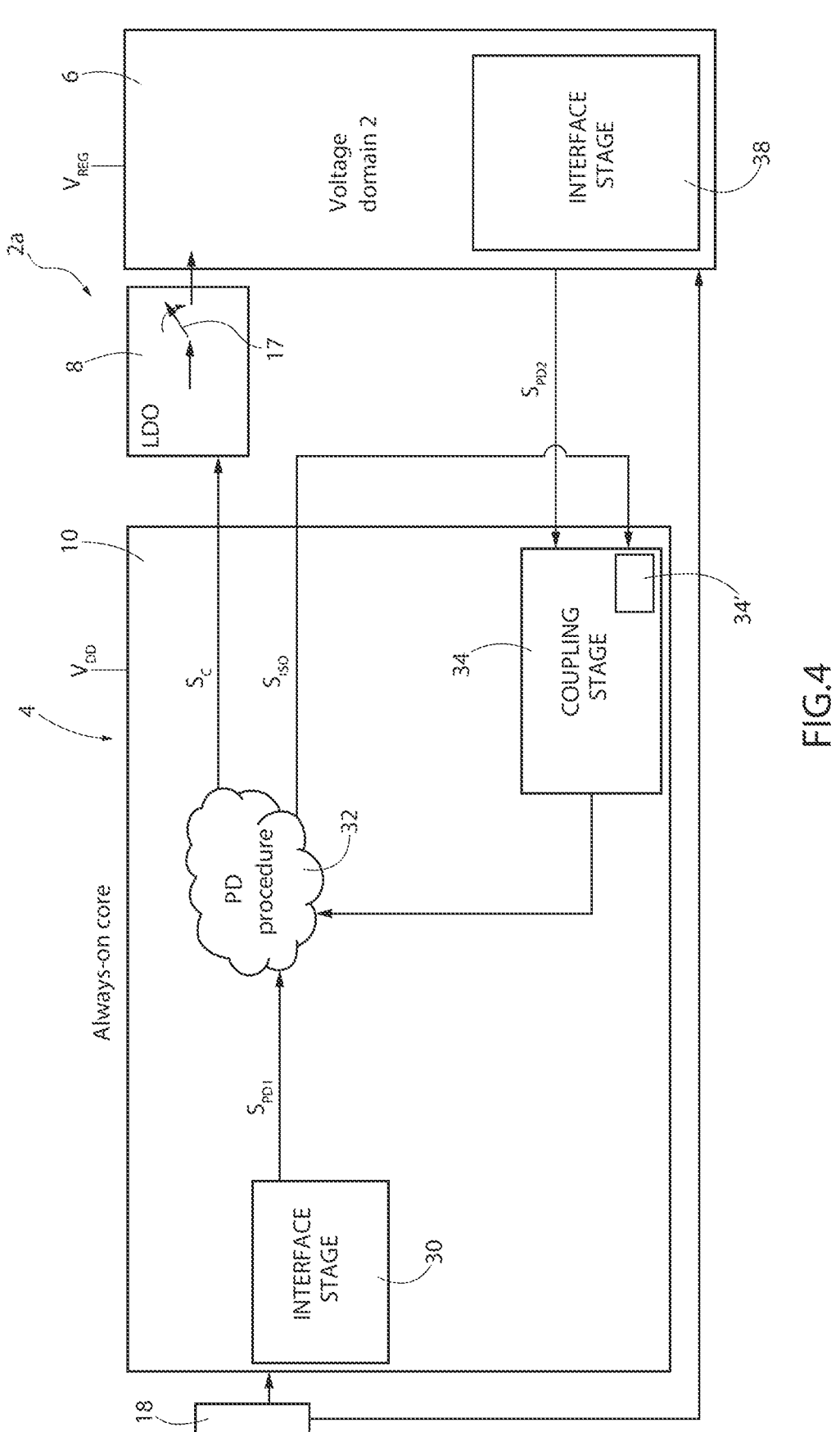
FIG. 4 is a more detailed block diagram of the electronic circuitry of the device of FIG. 1.

With reference to FIG. 4, a possible implementation of the aforementioned architecture of the microelectromechanical sensor device 1 is now described in a more detailed manner.

In this embodiment, the always-on core 10 comprises an interface stage 30, coupled to the input/output element 18 of the microelectromechanical sensor device 1 to receive the aforementioned first control signal $S_{PD1}$.

In a possible implementation, this interface stage 30 implements a serial interface, of the I2C(I3C)/SPI type; and the input/output element 18 is coupled to a serial bus interposed between the application or host processor and the microelectromechanical sensor device 1.

The always-on core 10 further comprises: a soft power-down procedure stage 32, having a first input coupled to the interface stage 30 and also a second input; and a coupling stage 34, interposed between the second voltage domain 6 and the same soft power-down procedure stage 32, having a respective input coupled to the second voltage domain 6 and an output coupled to the second input of the soft power-down procedure stage 32.

This coupling stage 34, in a manner not illustrated in detail, comprises level shifter and/or synchronization elements, configured to put in communication the first and second voltage domains 4, 6, which work at different voltages and are not synchronized with each other. Isolation cells 34' are also present at the input of the coupling stage 34, in order to isolate, under certain operating conditions, the first voltage domain 4 from the second voltage domain 6.

In detail, the soft power-down procedure stage 32 is configured to receive, at the first input, the first control signal $S_{PD1}$, as a function of which it enables the voltage regulator 8, through the control signal $S_C$. As a function of the same first control signal $S_{PD1}$, the soft power-down procedure stage 32 also generates a control signal $S_{ISO}$ to disable the isolation cells 34' of the coupling stage 34 (which are, in fact, active during the deep power down condition).

As previously indicated, the first control signal $S_{PD1}$ carries the aforementioned wake-up sequence, which determines the transition between the deep and soft power-down conditions.

For example, in the event that the interface stage 30 implements an SPI serial interface, the first control signal $S_{PD1}$ may entail writing a dedicated wake-up bit, using a standard-type SPI writing operation, for example performed at a clock frequency of 10 MHz. In a possible implementation, a high logic value '1' of the aforementioned wake-up bit (similarly, of the first control signal $S_{PD1}$) may determine wake-up from the deep power down condition.

In the event that the interface stage 30 implements a I2C/I3C serial interface, the first control signal $S_{PD1}$ may assume the following sequence: Start+Static Address+Nack, for the aforementioned wake-up from the deep power down condition.

The command for maintaining the deep power down condition may be, in both cases, a wake-up bit (similarly, the first control signal $S_{PD1}$) set to low logic level '0'.

The same soft power-down procedure stage 32 is configured to receive, at the second input, the second control signal $S_{PD2}$, coming from the second voltage domain 6 through the coupling stage 34.

The aforementioned second voltage domain 6 has a respective interface stage 38, for example of the I2C(I3C)/SPI serial type, which is coupled to the input/output element 18 (and to the corresponding serial bus), to receive from the outside, for example from the application or host processor, the aforementioned power-down or sleep command, which determines the return to the deep power down condition.

As a function of the same second control signal $S_{PD2}$, the soft power-down procedure stage 32 enables again the isolation cells 34' of the coupling stage 34 (through the aforementioned control signal $S_{ISO}$) and also deactivates the voltage regulator 8 (through the aforementioned control signal $S_C$).

As previously indicated, the always-on core 10 has functionalities reduced to a minimum, to minimize area and consumption and leakage currents thereof during the deep power down condition. For this reason, the aforementioned interface stage 30 is configured to recognize only the first control signal $S_{PD1}$; the second control signal $S_{PD2}$ is in fact received and recognized by the respective interface stage 38 of the second voltage domain 6.

In particular, the interface stage 30 of the always-on core 10 implements a slave interface (in the example of the I2C, I3C or SPI serial type) with reduced functionality, in particular limited to the ability to write in an internal register as a function of the aforementioned first control signal $S_{PD1}$ received from the outside, so as not to degrade the performances of the interface timings, which are more critical during reading operations. The same interface stage 30 of the always-on core 10 is not able to perform any other writing operation, nor any reading operation.

The various stage discussed herein are, for example, circuitry of the electronic circuitry 2.

Figure 5:
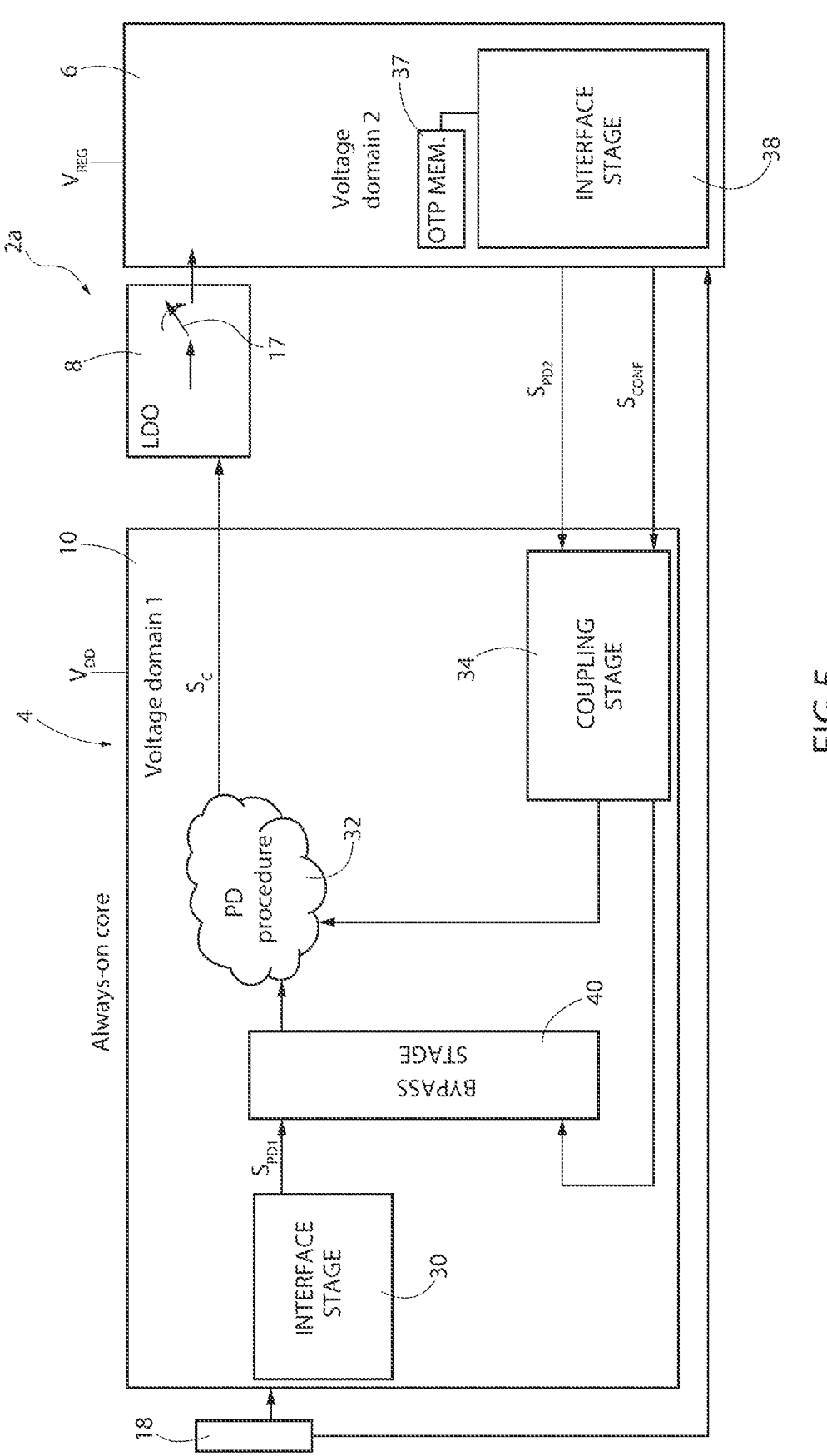
FIG. 5 is a block diagram of the electronic circuitry of a microelectromechanical sensor device, according to a further embodiment of the present solution.

With reference first to FIG. 5, a further embodiment of the present solution is now described, which provides for the possibility of disabling ("bypassing") the deep power down condition upon the first power-on of the microelectromechanical sensor device 1 and the consequent need to wake-up, through an external command, the same device to enter the soft power down condition.

This possibility may be advantageous, for example in order to maintain a compatibility of the microelectromechanical sensor device 1 with electronic apparatuses (and corresponding application or host processors) which do not provide (or are not programmable) for management of the transition between the aforementioned deep and soft power down conditions.

In this embodiment, as shown in the aforementioned FIG. 5, the always-on core 10 further comprises a bypass stage 40, interposed between the interface stage 30 and the soft power-down procedure stage 32 and configured to receive a configuration signal $S_{conf}$.

As will be discussed in detail below, the bypass stage 40 may inhibit the implementation of the deep power down condition upon powering on the microelectromechanical sensor device 1, as a function of the aforementioned configuration signal $S_{conf}$, the value of which may be set to configure the (soft or deep) power down condition which is implemented upon powering on the same microelectromechanical sensor device 1.

In particular, if the configuration signal $S_{conf}$ has a first logic value (for example low), the bypass stage 40 is configured to bypass (inhibit) the aforementioned first power-down control signal $S_{PD1}$ received at the input/output element 18, which, as previously discussed, is for the transition from the deep power down to the soft power down condition; and to automatically enable (i.e., without requesting a command by the user or the application or host processor) the soft power down condition upon powering on the microelectromechanical sensor device 1.

In the event that the configuration signal $S_{conf}$ has a second logic value (in the example a high value), the bypass stage 40 is configured to be substantially transparent as regards the operation of the always-on core 10, whose operation thus corresponds to what has been previously illustrated (in particular, with the microelectromechanical sensor device 1 which automatically enters the deep power down condition upon power-on and with the need to receive the aforementioned first power-down control signal $S_{PD1}$ for the transition to the soft power down condition).

In a possible implementation, illustrated in this FIG. 5, the configuration signal $S_{conf}$ is stored in the second voltage domain 6 in an internal non-reprogrammable read-only memory (of the OTP type), denoted with 37, and is received in the first voltage domain 4 from the second voltage domain 6 via the coupling stage 34. This configuration signal $S_{conf}$ is in the example a configuration bit written in the memory, for example of the OTP type, during factory calibration of the microelectromechanical sensor device 1.

Figure 6:
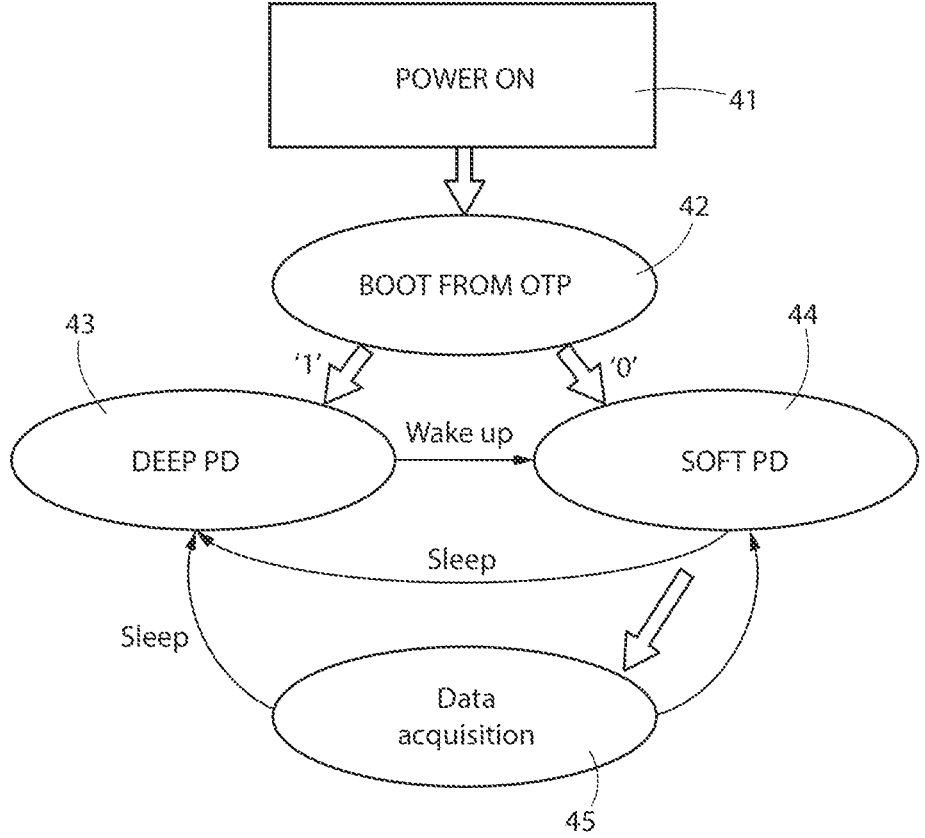
FIG. 6 is a flowchart of operations relating to the operation of the device of FIG. 5.

As shown in FIG. 6, after the first power-on of the microelectromechanical sensor device 1 (i.e., when the external power supply voltage $V_{DD}$ is provided), step 41, an automatic wake-up sequence is implemented, first retrieving, for example from the internal non-reprogrammable read-only memory 37, the value of the configuration signal $S_{conf}$, step 42. This value has been programmed for example in the factory calibration step during testing of the microelectromechanical sensor device 1.

In this step 42 the preliminary "boot" or restore operations are also performed, with the retrieval of configuration and trimming information of the microelectromechanical sensor device 1.

In the example, in the event that the configuration signal $S_{conf}$ has a high logic value, operation upon power-on is similar to what has been previously described, with the device entering the deep power down condition, step 43, and with the always-on core 10 waiting for the dedicated wake-up command, represented by the first control signal $S_{PD1}$ received from the outside, in order to enter the soft power down condition, step 44.

In the event that the configuration signal $S_{conf}$ has instead a low logic value, the device automatically enters the soft power down condition, aforementioned step 44 (thus bypassing the deep power down condition).

In a manner corresponding to what has been previously discussed, from this soft power down condition, the microelectromechanical sensor device 1 may enter the active or ON condition, shown in step 45, wherein the complete functionalities are ensured, for example for data acquisition and processing.

From this active condition, the microelectromechanical sensor device 1 may return to the soft power down condition, step 44. Furthermore, from the same soft power down condition, or from the active condition, the microelectromechanical sensor device 1 may be returned to the deep power down condition, step 43, after receiving the dedicated power-down or sleep command, represented by the second control signal $S_{PD2}$.

The operation described as regards the automatic sequence at power-on is also illustrated with reference to the timing diagrams shown in FIGS. 7A and 7B.

Figure 7A:
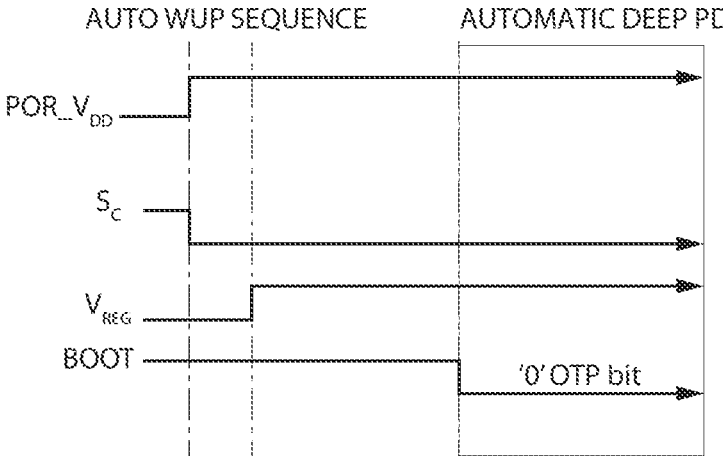
FIGS. 7A and 7B show timings of signals relating to the operations shown in FIG. 6.

In particular, FIG. 7A refers to the case in which the configuration signal $S_{conf}$ (for example, the corresponding OTP memory bit) has a low logic value and, at the end of the aforementioned automatic power-on sequence, the microelectromechanical sensor device 1 automatically enters the soft power down condition (thus bypassing the deep power down condition).

After enabling the external power supply voltage $V_{DD}$ (with the power-on reset signal POR_VDD going to the high state), in this case the voltage regulator 8 is immediately powered on (the control signal $S_C$ goes to the low state) for subsequent enabling of the regulated voltage $V_{REG}$ generated by the same voltage regulator 8. At the end of the restore operation (BOOT), the soft power down condition is automatically enabled.

Figure 7B:
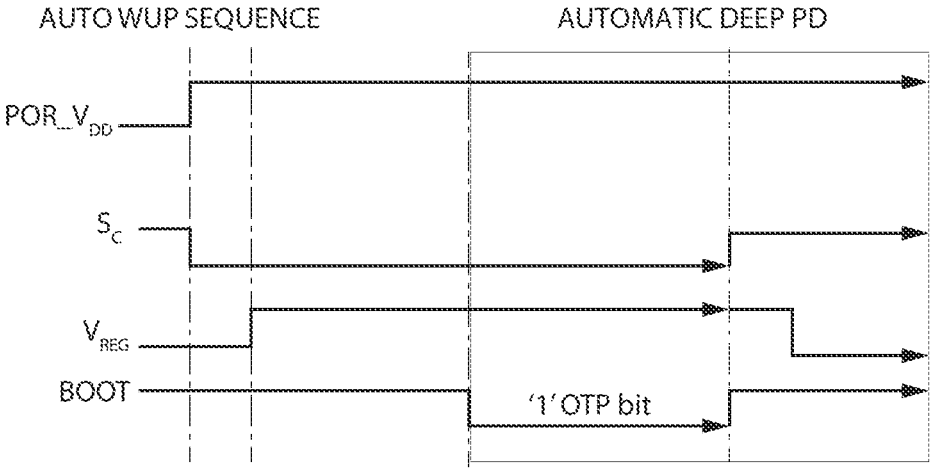

In the case of FIG. 7B, the configuration signal $S_{conf}$ has a high logic value and, at the end of the aforementioned automatic power-on sequence, the microelectromechanical sensor device 1 automatically enters the deep power down condition.

In particular, after enabling the external power supply voltage $V_{DD}$, also in this case the voltage regulator 8 is immediately powered on to enable the regulated voltage $V_{REG}$ and to execute the restore operation.

In this case, the value of the configuration signal $S_{conf}$ is such as to automatically enable the deep power down condition, whereby, after the aforementioned restore operation, the voltage regulator 8 is powered off and the regulated voltage $V_{REG}$ is inhibited.

Exit from the deep power down condition will occur after the arrival, from the outside, of the dedicated wake-up command through the first control signal $S_{PD1}$ (as previously discussed in detail).

Figure 8:
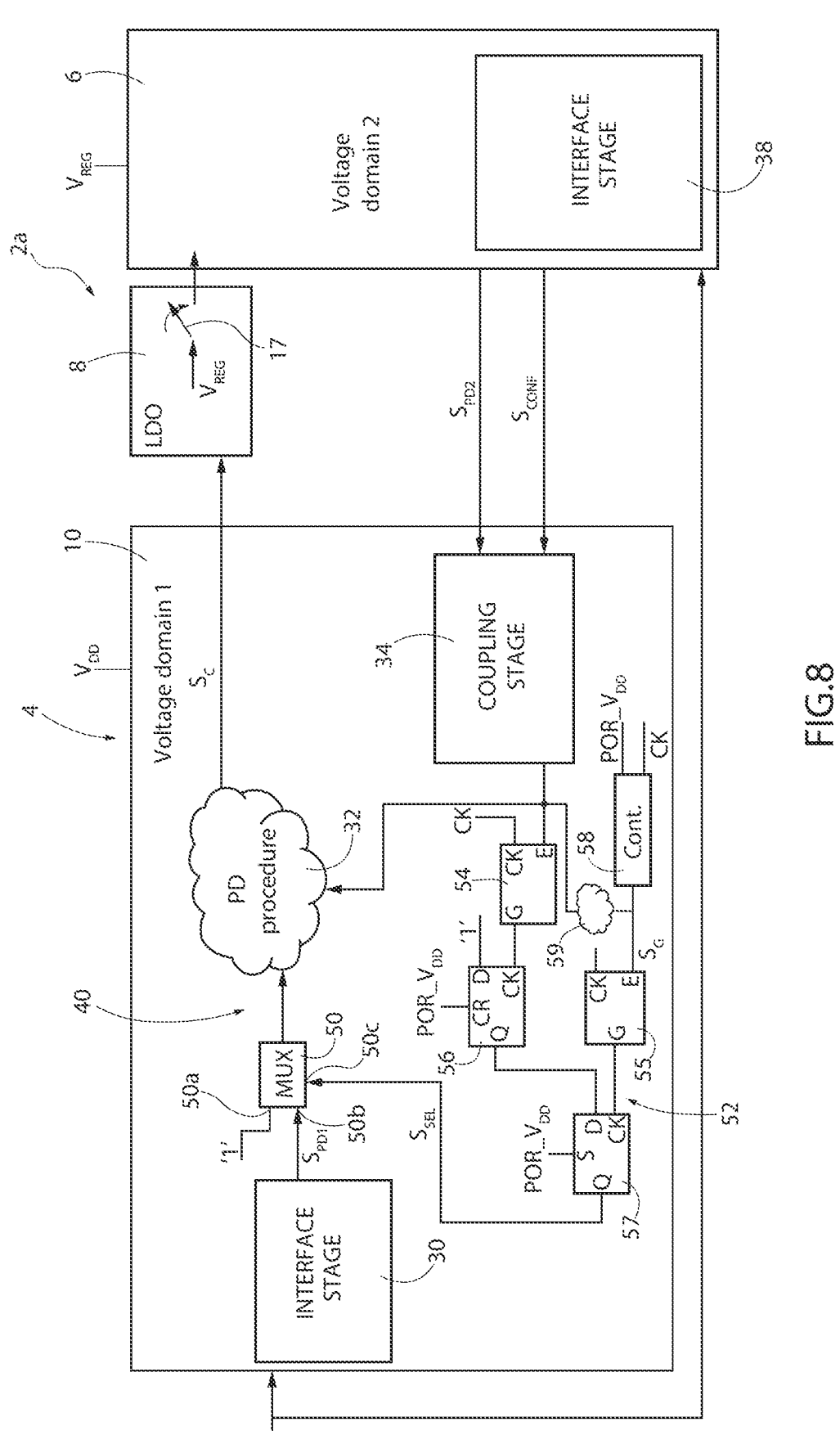
FIG. 8 is a more detailed block diagram of the electronic circuitry of the device of FIG. 5.

With reference to FIG. 8, a possible implementation of the aforementioned bypass stage 40 in the always-on core 10 is now described.

In detail, this bypass stage 40 comprises a multiplexer element 50, having a first signal input 50a, which receives an automatic-enabling command; a second signal input 50b, which receives the aforementioned first control signal $S_{PD1}$ from the interface stage 30; and a selection input 50c.

In particular, this automatic-enabling command has a value such as to automatically enable the soft power-down procedure stage 32; in the example discussed, this value corresponds to a high logic value '1'.

The bypass stage 40 also comprises a logic module 52, which receives at an input the aforementioned configuration signal $S_{conf}$ from the coupling stage 34 and is configured to generate, as a function of the same configuration signal $S_{conf}$, a selection signal $S_{SEL}$ for the selection input 50c of the multiplexer element 50.

In detail, this logic module 52 comprises a first and a second clocking gate cells 54, 55 (i.e., for selective supply of a timing signal).

The first clocking gate cell 54 has an enable input (indicated by E) coupled to the output of the coupling stage 34.

This first clocking gate cell 54 thus receives the configuration signal $S_{conf}$ and selectively provides at an output (indicated by G), as a function of the value of this configuration signal $S_{conf}$, a clock signal, CK, received at input. This clock signal CK is generated by a system oscillator, for example operating at 40 kHz, of the microelectromechanical sensor device 1 and determines the timing of the digital part 2a of the electronic circuitry 2 of the same microelectromechanical sensor device 1.

The second clocking gate cell 55 receives a gating signal SG at a respective enable input and selectively provides at an output, as a function of the value of this gating signal SG, the clock signal CK received at input.

The logic module 52 also comprises a first and a second sequential memory elements 56, 57, cascade-connected to each other, in particular D-type flip-flops with clear and, respectively, set asynchronous inputs receiving the aforementioned power-on reset signal POR_VDD.

In particular, the first sequential memory element 56 has a clock input connected to the output of the first clocking gate cell 54, a D input receiving a high logic value ('1') and a clear asynchronous input (CR) receiving the aforementioned power-on reset signal POR_VDD.

The second sequential memory element 57 has a clock input connected to the output of the second clocking gate cell 55, a D input connected to the Q output of the first sequential memory element 56 and a set asynchronous input (S) receiving the aforementioned power-on reset signal POR_VDD. The Q output of this second sequential memory element 57 provides the aforementioned selection signal $S_{SEL}$ for the selection input 50c of the multiplexer element 50.

The logic module 52 further comprises: a counter element 58, receiving the clock signal CK and the power-on reset signal POR_VDD and generating a count signal at the output; and a combinatorial logic block 59, which receives this count signal from the counter element 58 and also the configuration signal $S_{conf}$ from the coupling stage 34 and, based on these signals, generates the aforementioned gating signal SG for the second clocking gate cell 55.

During operation, upon powering on the microelectromechanical sensor device 1, the always-on core 10 is powered by the external voltage $V_{DD}$ and the power-on reset signal POR_VDD rises with the power supply, reaching the high logic value '1', when power supply becomes stable.

In this phase, the second sequential memory element 57 has the Q output at '1' due to the power-on reset signal POR_VDD (provided to the set input), while the first sequential memory element 56 has the Q output at '0', again due to the power-on reset signal POR_V$_{DD}$ (in this case provided to the clear input).

As previously indicated, the output of the second sequential memory element 57 provides the selection signal $S_{SEL}$ for the selection input 50c of the multiplexer element 50. The high logic value of this selection signal $S_{SEL}$ is maintained until the power-on reset action is finished, in order to avoid that the soft power-down procedure may start before the power supply has become stable.

Once the power-on reset phase, for stabilization of the power supply and reset of all sequential logic, has been completed, the second clocking gate cell 55 is enabled by the counter element 58 (which has reached the end of the count); consequently, the logic '0' on the Q output of the first sequential memory element 56 is transferred ("re-latched") onto the second sequential memory element 57, thereby modifying to the low logic value the selection signal $S_{SEL}$ for the multiplexer element 50.

This low logic value couples the first signal input 50a to the output, allowing the automatic-enabling command (having a high logic value '1') to pass to the output.

In this manner, the wake-up command decoded by the interface stage 30 (the first control signal $S_{PD1}$) is bypassed and the soft power-down procedure stage 32 is enabled to automatically implement the soft power-down procedure, which provides for the power-on of the voltage regulator 8 and the power supply of the second voltage domain 6.

Once the second voltage domain 6 is powered, the automatic power-on sequence provides for retrieval of the configuration and trimming information from the internal non-reprogrammable memory (OTP), among which the bit of the aforementioned configuration signal $S_{conf}$ is also present.

This bit, at the end of the restore sequence, is transferred through the coupling stage 34 (and the corresponding level and synchronization shifter elements) from the second voltage domain 6 to the first voltage domain 4.

If the logic value of this configuration signal $S_{conf}$ is low ('0'), the combinatorial logic block 59 of the logic module 52 is not activated and the soft power down condition is therefore maintained (which may subsequently evolve, as discussed, into the normal or data acquisition condition).

Conversely, if the logic value of this configuration signal $S_{conf}$ is high ('1'), the combinatorial logic block 59 is activated and the first clocking gate cell 54 is enabled.

The logic value '1' on the D input of the first sequential memory element 56 is then transferred first to the D input and then to the Q output of the second sequential memory element 57, thereby modifying to the high logic value the value of the selection signal $S_{SEL}$ for the multiplexer element 50.

This high logic value couples the second input 50b of the multiplexer element 50 to the output, so that the first control signal $S_{PD1}$ coming from the interface stage 30 is allowed to pass towards the output.

The value of this first control signal $S_{PD1}$ is initially at the low logic value, since there has been no wake-up command by the user or from the application or host processor.

Consequently, the soft power-down procedure stage 32, not receiving the decoding of a wake-up command, disables the voltage regulator 8 causing the system to enter the deep power down condition, waiting to receive the aforementioned wake-up command (through the first command signal $S_{PD1}$, as previously discussed in detail).

The advantages of the proposed solution are clear from the preceding description.

In any case, it is emphasized that the introduction of the control logic of the always-on core 10, to implement a first (deep) power down condition and the transition between the same deep power down condition and a second, different, (soft) power down condition, allows the power consumption of the microelectromechanical sensor device 1 to be reduced, due in particular to the leakage currents in the inactive condition.

Tests and simulations carried out by the Applicant have, for example, shown the possibility of obtaining a power consumption in deep power down condition of the order of a few tens of nA (for example around 20 nA), as compared to a consumption in a soft power down condition of some μA (for example about 2 μA), therefore two orders of magnitude lower.

Furthermore, the solution described provides for an automatic approach that does not require any additional intervention by the user or the host application, as regards management of power supply domains.

The same solution is advantageously completely embedded in the microelectromechanical sensor device 1, without requiring elements external to the same microelectromechanical sensor device 1, for example power supply management switches.

Furthermore, the embodiment which envisages the presence of the bypass stage 40 in the always-on core 10 is advantageous, allowing the possibility of configuring the power-down condition management mode (between deep and soft) upon first power-on of the microelectromechanical sensor device 1.

In particular, through the configuration signal $S_{conf}$ (for example a bit stored in a memory, for example of the OTP type, during the manufacturing step), it is substantially possible to have two operating modes with different consumption ranges according to the market the microelectromechanical sensor device 1 is aimed at.

This solution allows full compatibility of the electronic circuitry 2 of the microelectromechanical sensor device 1 with different solutions and applications, for example with solutions which do not provide for the possibility of providing a wake-up command from the outside for the transition from deep power down condition to soft power down condition.

For example, this solution allows, in case it is desired to prioritize the reduction of consumptions (for example in the case of wearable applications), the always-on core 10 to be configured (for example during the EWS—Electrical Wafer Sorting—step) to automatically activate the deep power down condition upon the first power-on; and/or, in case it is desired to prioritize a speed of response (for example in the case of mobile applications), the always-on core 10 to be configured to automatically activate the soft power down condition upon the first power-on.

In general, the solution described is therefore particularly advantageous for use in applications which desire particularly low power consumptions, powered by a battery, such as for example in mobile electronic apparatuses, in particular wearable or hearable apparatuses, such as electronic watches or bands or bracelets, earphones, smart contact lenses, smart pens or the like.

Figure 9:
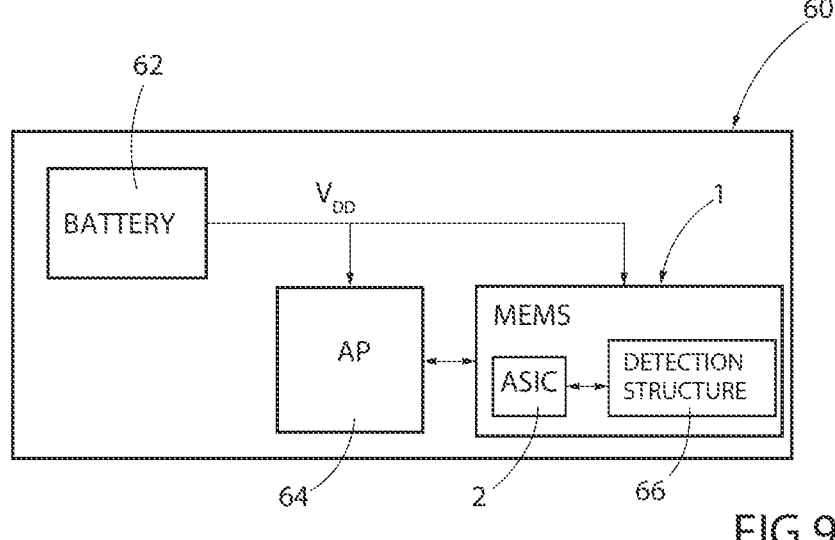
FIG. 9 is a schematic block diagram of an electronic apparatus wherein the microelectromechanical sensor device may be used.

In this regard, FIG. 9 schematically shows an electronic apparatus 60, in particular of the mobile or wearable type, powered by a battery 62.

The electronic apparatus 60 comprises a main control unit 64 (representing the aforementioned application or host processor), operatively coupled to the microelectromechanical sensor device 1 and configured to provide power supply management instructions to the power supply management core 10 (in the form of the aforementioned first and second control signals $S_{PD1}$, $S_{PD2}$).

The same microelectromechanical sensor device 1 comprises the electronic circuitry 2 and furthermore a micromechanical detection structure 66 associated therewith.

Finally, it is clear that modifications and variations may be made to what has been described and illustrated herein without thereby departing from the scope of the present disclosure.

In particular, it is emphasized that the aforementioned first power-down control signal $S_{PD1}$ received at the input/output element 18 may alternatively be an interrupt signal, the same input/output element 18 being for example associated with a global input/output terminal of the microelectromechanical sensor device 1.

In this case, a specific value, for example a high logic value '1', of the aforementioned interrupt signal may entail the transition from the deep power down condition to the soft power down condition.

Such a solution may advantageously allow implementing a cascade connection of multiple microelectromechanical sensor devices, referring to a single application or host processor, that may provide a first interrupt signal, which in this case may be retransmitted to the subsequent cascade-connected devices.

A microelectromechanical sensor device (1), may be summarized as including a detection structure (66) and an associated electronic circuitry (2); wherein said electronic circuitry (2) is configured to receive, when said microelectromechanical sensor device (1) is powered, an external power supply voltage ($V_{DD}$) and comprises a voltage regulator (8) configured to generate a regulated voltage ($V_{REG}$) having a value different from said external power supply voltage ($V_{DD}$) and at least one voltage domain (6) powered by said regulated voltage ($V_{REG}$), wherein said electronic circuitry (2) comprises a power supply management core (10), always powered by said external power supply voltage ($V_{DD}$) and configured to control said voltage regulator (8) to selectively interrupt the power supply of said voltage domain (6) to implement: a first power-down condition of said microelectromechanical sensor device (1) wherein said voltage regulator (8) is disabled; and a second power-down condition of said microelectromechanical sensor device (1) wherein said voltage regulator (8) is enabled to power said voltage domain (6) through said regulated voltage ($V_{REG}$), said first and second power-down conditions being associated with absence of data acquisition and/or processing by said microelectromechanical sensor device (1), wherein said power supply management core (10) is configured to automatically alternatively enable said first or said second power-down condition upon a first power-on of said microelectromechanical sensor device (1), as a function of a configuration signal ($S_{conf}$).

The electronic circuitry (2) may include a digital part (2a) and an analog part (2b), said digital part (2a) including said power supply management core (10) and said voltage domain (6); and wherein, during said first power-down condition, said power supply management core (10) is the only portion of said digital part (2a) of the electronic circuitry (2) being electrically powered.

The configuration signal ($S_{conf}$) may be stored in a non-programmable read-only memory (37), internal to said electronic circuitry (2); and wherein said power supply management core (10) is configured, after said first power-on, to receive said configuration signal ($S_{conf}$) from said non-programmable read-only memory (37).

The power supply management core (10) may include a control logic comprising: an interface stage (30) configured to receive from outside of said microelectromechanical sensor device (1) a first power-down control signal ($S_{PD1}$); and a power-down procedure stage (32) configured to generate a control signal ($S_C$) for said voltage regulator (8) as a function of said first power-down control signal ($S_{PD1}$).

The power-down procedure stage (32) may be configured to manage, when enabled by said first control signal ($S_{PD1}$), a transition between said first power-down condition and said second power-down condition of said microelectromechanical sensor device (1).

The power supply management core (10) may further include a bypass stage (40), interposed between the interface stage (30) and the power-down procedure stage (32) and configured to receive the configuration signal ($S_{conf}$) and, as a function of said configuration signal ($S_{conf}$), bypass said first control signal ($S_{PD1}$) for automatic enabling of said second power-down condition upon power-on of the microelectromechanical sensor device (1).

The bypass stage (40) may include a multiplexer element (50), having a first signal input (50a) for receiving an automatic-enabling command; a second signal input (50b) for receiving said first control signal ($S_{PD1}$) from the interface stage (30); an output connected to said power-down procedure stage (32); a selection input (50c), for receiving a selection signal ($S_{SEL}$) to alternatively pass said first control signal ($S_{PD1}$) or said automatic-enabling command to the output; wherein said automatic-enabling command is configured to automatically enable said power-down procedure stage (32) for the transition between said first power-down condition and said second power-down condition of said microelectromechanical sensor device (1).

The bypass stage (40) may further include a logic module (52), configured to receive at an input said configuration signal ($S_{conf}$) and to generate, as a function of said configuration signal ($S_{conf}$), said selection signal ($S_{SEL}$).

The power supply management core (10) may include a coupling stage (34), interposed between said voltage domain (6) and said power-down procedure stage (32) and configured to receive said configuration signal ($S_{conf}$) from said voltage domain (6) after the first power-on of said microelectromechanical sensor device (1).

After said first power-on, said voltage regulator (8) may be automatically enabled to provide said regulated voltage ($V_{REG}$) to said voltage domain (6).

The power supply management core (10) may be configured to receive a second power-down control signal ($S_{PD2}$) and to enable again said first power-down condition as a function of said second control signal ($S_{PD2}$).

The voltage domain (6) may include an own interface stage (38) configured to receive power supply management instructions from outside of said microelectromechanical sensor device (1) and provide said second power-down control signal ($S_{PD2}$) to said power supply management core (10) as a function of said power supply management instructions.

The voltage domain (6) may include digital resources powered by said regulated voltage ($V_{REG}$) divided into a number of sub-domains (12), distinct from each other and selectively controllable in power-on or power-off by a switching control logic (15); wherein, during said second power-down condition, said switching control logic (15) is configured to interrupt power supply of one or more of said sub-domains (12) to reduce a power consumption of said microelectromechanical sensor device (1).

An electronic apparatus (60) of the mobile or wearable type, may be summarized as including a battery (62), a control unit (64) and the microelectromechanical sensor device (1) according to any of the preceding embodiments; wherein said battery (62) is configured to generate said external power supply voltage ($V_{DD}$) and said control unit (64) is configured to generate power supply management instructions for said power supply management core (10).

A power supply management method for a microelectromechanical sensor device (1) may be summarized as including a detection structure (66) and an associated electronic circuitry (2); wherein said electronic circuitry (2) is configured to receive, when said microelectromechanical sensor device (1) is powered, an external power supply voltage ($V_{DD}$) and comprises a voltage regulator (8) configured to generate a regulated voltage ($V_{REG}$) having a value different from said external power supply voltage ($V_{DD}$) and at least one voltage domain (6) powered by said regulated voltage ($V_{REG}$), the method comprising controlling said voltage regulator (8) to selectively interrupt power supply of said voltage domain (6) to implement: a first power-down condition of said microelectromechanical sensor device (1) wherein said voltage regulator (8) is disabled; and a second power-down condition of said microelectromechanical sensor device (1) wherein said voltage regulator (8) is enabled to power said voltage domain (6) through said regulated voltage ($V_{REG}$), said first and second power-down conditions being associated with absence of data acquisition and/or processing by said microelectromechanical sensor device (1), further comprising automatically alternatively enabling said first or said second power-down condition upon a first power-on of said microelectromechanical sensor device (1), as a function of a configuration signal ($S_{conf}$).

The configuration signal ($S_{conf}$) may be stored in a non-programmable read-only memory (37) internal to said electronic circuitry (2); further comprising, after said first power-on, reading said configuration signal ($S_{conf}$) from said non-programmable read-only memory (37).

The method may include receiving from outside of said microelectromechanical sensor device (1) a first power-down control signal ($S_{PD1}$); and managing, as a function of said first control signal ($S_{PD1}$), a transition between said first power-down condition and said second power-down condition of said microelectromechanical sensor device (1).

The method may include after said first power-on and as a function of said configuration signal ($S_{conf}$), alternatively: automatically implementing said first power-down condition and then waiting for said first control signal ($S_{PD1}$) to implement said transition between said first and second power-down conditions; or bypassing said first control signal nal ($S_{PD1}$) for automatic enabling of said second power-down condition without requiring reception of said first control signal ($S_{PD1}$).

The method may further include receiving a second power-down control signal ($S_{PD2}$) and enabling again said first power-down condition as a function of said second control signal ($S_{PD2}$).

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A microelectromechanical sensor device, comprising:
a detection structure; and
electronic circuitry coupled to the detection structure, the electronic circuitry configured to receive, in a case where the microelectromechanical sensor device is powered, an external power supply voltage, the electronic circuitry including:
a voltage regulator configured to generate a regulated voltage having a value different from the external power supply voltage;
at least one voltage domain powered by the regulated voltage;
a power supply management core configured to be always powered by the external power supply voltage in the case where the microelectromechanical sensor device is powered, and configured to control the voltage regulator to selectively interrupt power supply of the at least one voltage domain to implement:
a first power-down condition of the microelectromechanical sensor device in which the voltage regulator is disabled; and
a second power-down condition of the microelectromechanical sensor device in which the voltage regulator is enabled to power the at least one voltage domain with the regulated voltage, the first and second power-down conditions being associated with absence of data acquisition or processing by the microelectromechanical sensor device,
the power supply management core configured to automatically alternatively enable the first or the second power-down condition upon a first power-on of the microelectromechanical sensor device, as a function of a configuration signal.

2. The microelectromechanical sensor device according to claim 1,
wherein the electronic circuitry includes a digital part and an analog part, the digital part including the power supply management core and the at least one voltage domain; and
wherein, during the first power-down condition, the power supply management core is the only portion of the digital part of the electronic circuitry being electrically powered.

3. The microelectromechanical sensor device according to claim 1,
wherein the electronic circuitry includes a non-programmable read-only memory;

wherein the configuration signal is stored in the non-programmable read-only memory; and wherein the power supply management core is configured, after the first power-on, to receive the configuration signal from the non-programmable read-only memory.

4. The microelectromechanical sensor device according to claim 1, wherein the power supply management core includes a control logic including:

an interface stage configured to receive, from outside of the microelectromechanical sensor device, a first power-down control signal; and a power-down procedure stage configured to generate a control signal for the voltage regulator as a function of the first power-down control signal.

5. The microelectromechanical sensor device according to claim 4, wherein the power-down procedure stage is configured to manage, in response to being enabled by the first power-down control signal, a transition between the first power-down condition and the second power-down condition of the microelectromechanical sensor device.

6. The microelectromechanical sensor device according to claim 5, wherein the power supply management core includes:

a bypass stage interposed between the interface stage and the power-down procedure stage, configured to receive the configuration signal, and configure to, as a function of the configuration signal, bypass the first power-down control signal for automatic enabling of the second power-down condition upon power-on of the microelectromechanical sensor device.

7. The microelectromechanical sensor device according to claim 6, wherein the bypass stage includes:

a multiplexer element having a first signal input configured to receive an automatic-enabling command;

a second signal input configured to receive the first power-down control signal from the interface stage;

an output connected to the power-down procedure stage;

a selection input configured to receive a selection signal to alternatively pass the first power-down control signal or the automatic-enabling command to the output; and wherein the automatic-enabling command is configured to automatically enable the power-down procedure stage for the transition between the first power-down condition and the second power-down condition of the microelectromechanical sensor device.

8. The microelectromechanical sensor device according to claim 7, wherein the bypass stage includes a logic module configured to receive, at an input, the configuration signal, and to generate, as a function of the configuration signal, the selection signal.

9. The microelectromechanical sensor device according to claim 4, wherein the power supply management core includes:

a coupling stage, interposed between the at least one voltage domain and the power-down procedure stage, and configured to receive the configuration signal from the at least one voltage domain after the first power-on of the microelectromechanical sensor device.

10. The microelectromechanical sensor device according to claim 9, wherein, after the first power-on, the voltage regulator is automatically enabled to provide the regulated voltage to the voltage domain.

11. The microelectromechanical sensor device according to claim 1, wherein the power supply management core is configured to receive a second power-down control signal, and to enable the first power-down condition as a function of the second power-down control signal.

12. The microelectromechanical sensor device according to claim 11, wherein the at least one voltage domain includes an own interface stage configured to receive power supply management instructions from outside of the microelectromechanical sensor device, and provide the second power-down control signal to the power supply management core as a function of the power supply management instructions.

13. The microelectromechanical sensor device according to claim 1, wherein the at least one voltage domain includes digital resources powered by the regulated voltage and divided into a number of sub-domains, distinct from each other and selectively controllable in power-on or power-off by a switching control logic; and wherein, during the second power-down condition, the switching control logic is configured to interrupt power supply of one or more of the sub-domains to reduce a power consumption of the microelectromechanical sensor device.

14. An electronic apparatus, comprising:

a battery configured to generate an external power supply voltage;

a microelectromechanical sensor device including:

a detection structure; and electronic circuitry coupled to the detection structure, the electronic circuitry configured to receive, in a case where the microelectromechanical sensor device is powered, the external power supply voltage, the electronic circuitry including:

a voltage regulator configured to generate a regulated voltage having a value different from the external power supply voltage;

at least one voltage domain powered by the regulated voltage;

a power supply management core configured to be always powered by the external power supply voltage in the case where the microelectromechanical sensor device is powered, and configured to control the voltage regulator to selectively interrupt the power supply of the at least one voltage domain to implement:

a first power-down condition of the microelectromechanical sensor device in which the voltage regulator is disabled; and a second power-down condition of the microelectromechanical sensor device in which the voltage regulator is enabled to power the at least one voltage domain with the regulated voltage, the first and second power-down conditions being associated with absence of data acquisition or processing by the microelectromechanical sensor device, the power supply management core configured to automatically alternatively enable the first or the second power-down condition upon a first power-on of the microelectromechanical sensor device, as a function of a configuration signal; and a control unit configured to generate power supply management instructions for the power supply management core.

15. The electronic apparatus according to claim 14, wherein the electronic apparatus is a mobile or wearable type of electronic apparatus.

16. A power supply management method, comprising:

receiving, by electronic circuitry of a microelectromechanical sensor device, an external power supply voltage in a case where the microelectromechanical sensor device is powered, the microelectromechanical sensor device including a detection structure coupled to the electronic circuitry, the electronic circuitry including a voltage regulator, at least one voltage domain, and a power supply management core;

generating, by the voltage regulator, a regulated voltage having a value different from the external power supply voltage;

powering, by the voltage regulator, the at least one voltage domain with the regulated voltage;

controlling, by the power supply management core, the voltage regulator to selectively interrupt power supply of the at least one voltage domain to implement:

a first power-down condition of the microelectromechanical sensor device in which the voltage regulator is disabled; and a second power-down condition of the microelectromechanical sensor device in which the voltage regulator is enabled to power the at least one voltage domain with the regulated voltage, the first and second power-down conditions being associated with absence of data acquisition or processing by the microelectromechanical sensor device; and automatically alternatively enabling, by the power supply management core, the first or the second power-down condition upon a first power-on of the microelectromechanical sensor device, as a function of a configuration signal.

17. The method according to claim 16, wherein the configuration signal is stored in a non-programmable read-only memory internal to the electronic circuitry; and wherein the method includes, after the first power-on, reading, by the power supply management core, the configuration signal from the non-programmable read-only memory.

18. The method according to claim 16, further comprising:

receiving, by the power supply management core and from outside of the microelectromechanical sensor device, a first power-down control signal; and managing, by the power supply management core and as a function of the first power-down control signal, a transition between the first power-down condition and the second power-down condition of the microelectromechanical sensor device.

19. The method according to claim 18, further comprising:

after the first power-on and as a function of the configuration signal:

automatically implementing, by the power supply management core, the first power-down condition and waiting for the first power-down control signal to implement the transition between the first and second power-down conditions; or bypassing, by the power supply management core, the first power-down control signal for automatic enabling of the second power-down condition without requiring reception of the first power-down control signal.

20. The method according to claim 16, further comprising:

receiving, by the power supply management core, a second power-down control signal; and enabling, by the power supply management core, the first power-down condition as a function of the second power-down control signal.

* * * * *